United States Patent
Bouvier et al.

(10) Patent No.: US 9,876,142 B2
(45) Date of Patent: Jan. 23, 2018

(54) OPTOELECTRONIC DEVICE COMPRISING LIGHT-EMITTING DIODES

(71) Applicant: Aledia, Grenoble (FR)

(72) Inventors: Christophe Bouvier, Grenoble (FR); Erwan Dornel, Fontaine (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/024,006

(22) PCT Filed: Sep. 30, 2014

(86) PCT No.: PCT/FR2014/052474
§ 371 (c)(1),
(2) Date: Mar. 22, 2016

(87) PCT Pub. No.: WO2015/044622
PCT Pub. Date: Apr. 2, 2015

(65) Prior Publication Data
US 2016/0233381 A1    Aug. 11, 2016

(30) Foreign Application Priority Data

Sep. 30, 2013 (FR) ...................................... 1359410

(51) Int. Cl.
*H01L 33/24* (2010.01)
*H01L 33/08* (2010.01)
(Continued)

(52) U.S. Cl.
CPC .......... *H01L 33/24* (2013.01); *H01L 21/0254* (2013.01); *H01L 21/02458* (2013.01);
(Continued)

(58) Field of Classification Search
CPC ......... H01L 33/08; H01L 33/18; H01L 33/24; H01L 29/0676; H01L 21/02603;
(Continued)

(56) References Cited

U.S. PATENT DOCUMENTS

2004/0077156 A1* 4/2004 Tsakalakos ......... H01L 21/0237
                                                      438/479
2004/0109666 A1* 6/2004 Kim, II .................... F24J 2/067
                                                      385/147
(Continued)

FOREIGN PATENT DOCUMENTS

EP        2254164 A1    11/2010
JP      2007049063 A     2/2007
(Continued)

OTHER PUBLICATIONS

Written Opinion, dated Jul. 16, 2015, from corresponding International Application No. PCT/FR2014/052474.
(Continued)

*Primary Examiner* — Marvin Payen
*Assistant Examiner* — Jeremy Joy
(74) *Attorney, Agent, or Firm* — Wolf, Greenfield & Sacks, P.C.

(57) ABSTRACT

An optoelectronic device including a support having a first face; a first set of first light-emitting diodes having first wire-like, conical or frustoconical semiconductor elements, each resting on a second face of a first contact stud, each first contact stud including, in addition, a third face opposite the second face; and a first conductive layer connecting the first contact studs and extending at least over part of the second face or the third face of each first contact stud, the first conductive layer and/or the first contact studs resting on the support.

23 Claims, 4 Drawing Sheets

(51) Int. Cl.
*H01L 33/00* (2010.01)
*H01L 29/06* (2006.01)
*H01L 21/02* (2006.01)
*H01L 33/32* (2010.01)
*H01L 33/20* (2010.01)
*H01L 33/18* (2010.01)
*H01L 33/38* (2010.01)

(52) U.S. Cl.
CPC .... *H01L 21/02603* (2013.01); *H01L 29/0676* (2013.01); *H01L 33/005* (2013.01); *H01L 33/007* (2013.01); *H01L 33/08* (2013.01); *H01L 33/18* (2013.01); *H01L 33/20* (2013.01); *H01L 33/32* (2013.01); *H01L 33/38* (2013.01)

(58) Field of Classification Search
CPC ....... H01L 33/20; H01L 33/007; H01L 33/32; H01L 21/0254; H01L 21/02458
See application file for complete search history.

(56) References Cited

U.S. PATENT DOCUMENTS

| | | | | |
|---|---|---|---|---|
| 2006/0273389 A1* | 12/2006 | Cohen | ............ | B82Y 10/00 257/331 |
| 2010/0102380 A1 | 4/2010 | Ohlsson et al. | | |
| 2010/0163887 A1* | 7/2010 | Kim | ............ | H01L 27/153 257/76 |
| 2011/0254034 A1* | 10/2011 | Konsek | ............ | B82Y 20/00 257/98 |
| 2012/0061646 A1* | 3/2012 | Yi | ............ | H01L 33/24 257/13 |
| 2012/0205614 A1 | 8/2012 | Templier et al. | | |
| 2012/0222732 A1* | 9/2012 | Choi | ............ | H01L 33/007 136/255 |
| 2013/0015426 A1* | 1/2013 | Waag | ............ | H01L 21/0242 257/13 |
| 2013/0248817 A1* | 9/2013 | Kim | ............ | H01L 33/08 257/13 |
| 2014/0077151 A1* | 3/2014 | Pougeoise | ............ | H01L 21/0254 257/12 |
| 2014/0077156 A1* | 3/2014 | Bavencove | ............ | H01L 27/153 257/13 |
| 2015/0076535 A1* | 3/2015 | Choung | ............ | H01L 33/08 257/91 |
| 2015/0280053 A1* | 10/2015 | Gilet | ............ | B82Y 40/00 438/46 |

FOREIGN PATENT DOCUMENTS

| | | |
|---|---|---|
| WO | WO 2009/009612 A2 | 1/2009 |
| WO | WO 2011/117056 A1 | 9/2011 |
| WO | WO 2012/075461 A1 | 6/2012 |

OTHER PUBLICATIONS

International Search Report, dated Jul. 16, 2015, from corresponding International Application No. PCT/FR2014/052474.

* cited by examiner

OPTOELECTRONIC DEVICE COMPRISING LIGHT-EMITTING DIODES

CROSS-REFERENCE TO RELATED APPLICATIONS

This application is the national phase of International Application No. PCT/FR2014/052474, filed on Sep. 30, 2014, which claims priority to French Application No. 13/59410, filed on Sep. 30, 2013, which applications are hereby incorporated by reference to the maximum extent allowable by law The present patent application claims the priority benefit of French patent application FR13/59410 which is herein incorporated by reference.

BACKGROUND

The present invention generally relates to optoelectronic devices based on semiconductor materials and to methods for manufacturing the same. The present invention more specifically relates to optoelectronic devices comprising light-emitting diodes formed by three-dimensional elements, particularly semiconductor microwires or nanowires.

DISCUSSION OF THE RELATED ART

Phrase "optoelectronic devices with light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

Three-dimensional elements, particularly semiconductor microwires or nanowires, of a plurality of optoelectronic devices are generally formed on the front surface of a substrate. A layer of a material favoring the growth of three-dimensional elements, called seed layer, may be interposed between the substrate and the three-dimensional elements.

The injection of current into the three-dimensional elements may be performed from the rear surface of the substrate. However, the current should then cross the entire thickness of the substrate. In the case of a semiconductor substrate, for example, made of silicon, this may result in significant losses by Joule effect. It may further be difficult to obtain a uniform distribution of the current between the three-dimensional elements.

The injection of current into the three-dimensional elements may be performed from the front surface of the substrate by the seed layer. However, to favor the growth of three-dimensional elements having the desired crystallographic properties, the seed layer should be relatively thin. This may result in significant losses by Joule effect and in difficulties in providing a uniform distribution of the current between the three-dimensional elements.

SUMMARY

Thus, an object of an embodiment is to at least partly overcome the disadvantages of previously-described optoelectronic devices comprising light-emitting diodes, particularly with microwires or nanowires.

Another object of an embodiment is to decrease losses by Joule effect on injection of current into light-emitting diodes.

Another object of an embodiment is to improve the homogeneity of the current distribution between the light-emitting diodes.

Thus, an embodiment provides an optoelectronic device comprising:

a support comprising a first surface;

a first assembly of first light-emitting diodes comprising first wire-shaped, conical, or frustoconical semiconductor elements, made of a first material and each resting on a second surface of a first pad made of a second material different from the first material, each first pad further comprising a third surface opposite to the second surface; and a first conductive layer connecting the first pads and extending at least over a portion of the second surface or of the third surface of each first pad, the first conductive layer and/or the first pads resting on the support.

According to an embodiment, the first conductive layer is made of a third material different from the first material and from the second material.

According to an embodiment, the first conductive layer is made of a material selected from the group comprising alloys comprising a transition metal or more than one transition metal from among W, Ta, Re, Os, Mo, Nb, Pt, Pd, Cr, Zr, Hf, Cu, Co, Ni, and Ti and their silicided, nitrided, and carbided forms.

According to an embodiment, the first conductive layer is made of a material selected from the group comprising silicides and metals capable of forming a silicide, particularly Pt, PtSi, Ti, TiSi2, Co, CoSi2, CoSi, Co2Si, Ni, NiSi, NiSi2, W, WSi2, Mo, MoSi2, Ta, and TaSi2.

According to an embodiment, the first conductive layer is made of a material selected from the group comprising silicides and metals capable of forming a stable silicide on silicon at a 1,000° C. temperature, particularly W, WSi2, Mo, MoSi2, Ta and TaSi2, Ti, TiSi2, Co, CoSi2, TiW, and TiWSi.

According to an embodiment, the first conductive layer is made of a material selected from among materials having a thermal expansion coefficient close, to within 10%, to the thermal expansion coefficient of silicon or of polysilicon, particularly W, WSi2, TiW, TiWSi2.

According to an embodiment, the first pads rest on the support and the first conductive layer extends on the support between the first pads and covers a portion of the second surface of each first pad, the first conductive layer being open at the locations of each first semiconductor element.

According to an embodiment, the device further comprises a first insulating layer at least partly covering the first conductive layer.

According to an embodiment, the first insulating layer extends between the first semiconductor elements and the first conductive layer.

According to an embodiment, the first conductive layer is in contact with the first semiconductor elements.

According to an embodiment, the support comprises a semiconductor substrate and an insulating region between the substrate and the first conductive layer.

According to an embodiment, the first conductive layer rests on the first surface and each first pad rests on the first conductive layer on the side of the third surface.

According to an embodiment, a second insulating layer covers the first conductive layer and a portion of each first pad.

According to an embodiment, the portion of the first conductive layer which is not covered with the first pads is nitrided at its surface.

According to an embodiment, each first pad is made of a material selected from the group comprising a nitride, a carbide, or a boride of a transition metal of column IV, V, or VI of the periodic table of elements or a combination of these compounds.

According to an embodiment, the support is a doped or undoped semiconductor substrate, with a dopant concentration smaller than or equal to $5*10^{16}$ atoms/cm3, the device further comprising a doped semiconductor region extending in the substrate from the first surface with a dopant concentration in the range from $5*10^{16}$ atoms/cm3 to $2*10^{20}$ atoms/cm3, said region being in contact with the first conductive layer.

According to an embodiment, the device further comprises:

a first electrode connected to the first light-emitting diodes;

a second assembly of second light-emitting diodes comprising second wire-shaped, conical, or frustoconical semiconductor elements, each resting on a fourth surface of a second pad, each second pad further comprising a fifth surface opposite to the fourth surface;

a second conductive layer connecting the second pads and extending at least over a portion of the fourth surface or of the fifth surface of each second pad, the second conductive layer and/or the second pads resting on the support; and a second electrode connected to the second light-emitting diodes and coming into contact with the first conductive layer.

An embodiment also provides a method of manufacturing an optoelectronic device, comprising the steps of:

providing a support comprising a first surface;

forming a first assembly of first light-emitting diodes comprising first wire-shaped, conical, or frustoconical semiconductor elements, each resting on a second surface of a first pad, each first pad further comprising a third surface opposite to the second surface; and forming a first conductive layer connecting first pads and extending at least over a portion of the second surface or of the third surface of each first pad, the first conductive layer and/or the first pads resting on the support.

According to an embodiment, the method comprises the successive steps of:

forming the first pads on the support;

covering the first pads and the support with a third conductive layer;

forming first openings in the third conductive layer to form the first conductive layer, each first opening exposing a first portion of one of the first pads;

covering the third conductive layer and the first exposed portions with a third insulating layer;

forming second openings in the third insulating layer, each second opening exposing a second portion of one of the first pads; and growing the first semiconductor elements from the second exposed portions of the first pads.

According to an embodiment, the method comprises the successive steps of:

forming the first pads on the support;

covering the first pads and the support with a fourth conductive layer;

covering the fourth conductive layer with a fourth insulating layer;

forming third openings in the fourth insulating layer and fourth openings, continuing the third openings, in the fourth conductive layer, to form the first conductive layer, each fourth opening exposing a third portion of one of the first pads; and growing the first semiconductor elements from the third exposed portions of the first pads.

According to an embodiment, the method comprises the successive steps of:

covering the support with a fifth conductive layer;

forming the first pads on the fifth conductive layer;

covering the fifth conductive layer and the first pads with a fifth insulating layer;

forming fifth openings in the fifth insulating layer, each fifth opening exposing a fourth portion of one of the first pads; and growing the first semiconductor elements from the fourth exposed portions of the first pads.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
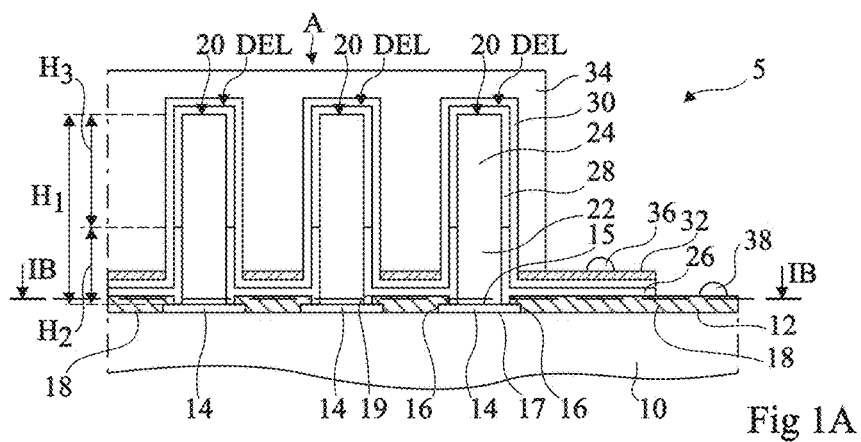
FIGS. 1A and 1B are partial simplified cross-section views of an embodiment of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present description relates to optoelectronic devices comprising three-dimensional elements, for example, microwires, nanowires, conical elements, or frustoconical elements. In the following description, embodiments are described for optoelectronic devices comprising microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

According to an embodiment, the three-dimensional elements forming the light-emitting diodes are formed on seed pads made of a material favoring the growth of the three-dimensional elements. To properly bias the light-emitting diodes, a layer of a conductive material, possibly perforated at the locations of the three-dimensional elements, is provided in contact with the seed pads. The seed pads may be arranged on the conductive layer or the conductive layer may partially cover the seed pads. In all cases, there is at least a partial overlapping between the upper surface or the lower surface of each seed pad and the conductive layer.

Figure 1B:
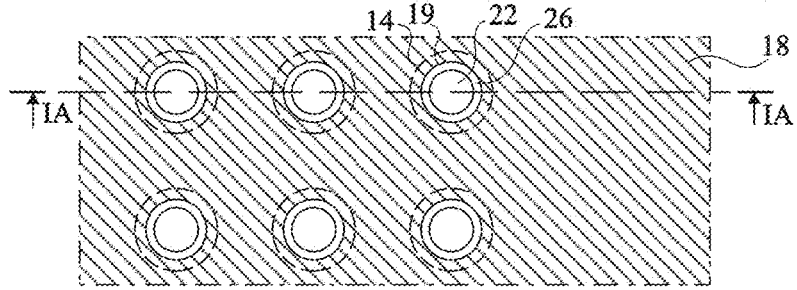

FIGS. 1A and 1B are partial simplified cross-section views of an embodiment of an optoelectronic device 5 formed from wires such as previously described and capable of emitting an electromagnetic radiation.

FIG. 1A shows a structure comprising, from bottom to top:

a substrate 10 comprising an upper surface 12, preferably planar at least at the level of the light-emitting diodes;

seed pads 14 favoring the growth of wires 20 and arranged on surface 12, each seed pad 14 comprising an upper wall 15, lateral walls 16, and a lower wall 17, lower wall 17 being opposite to upper wall 15 and resting on substrate 10;

a conductive layer 18 extending between seed pads 14 and partially covering upper walls 15 of seed pads 14, conductive layer 18 comprising openings 19, each opening exposing a portion of upper wall 15 of one of seed pads 14;

wires 20 (three wires being shown in FIG. 1A) of height H1, each wire 20 being in contact with upper surface 15 of one of seed pads 14, each wire 20 comprising a lower portion 22, of height H2, in contact with seed pad 14 and an upper portion 24, of height H3, continuing lower portion 22;

an insulating layer 26 extending on conductive layer 18 and on the lateral sides of lower portion 22 of each wire 20;

a shell 28 comprising a stack of semiconductor layers covering each upper portion 24;

a layer 30 forming an electrode covering each shell 28 and further extending on insulating layer 26;

a conductive layer 32 covering electrode layer 30 between wires 20 without extending on wires 20;

an encapsulation layer 34 covering the portion of the optoelectronic device where wires 20 are formed;

a pad 36 of a conductive material extending on conductive layer 32; and a pad 38 of a conductive material extending on conductive layer 18.

Optoelectronic device 5 may further comprise a layer of phosphors, not shown, provided on encapsulation layer 34 or confounded therewith.

The assembly formed by each wire 20, the associated seed pad 14, and shell 28 forms a light-emitting diode DEL. The base of diode DEL corresponds to seed pad 14. Light-emitting diodes DEL are connected in parallel and form an assembly A of light-emitting diodes. Assembly A may comprise from a few light-emitting diodes DEL to one thousand light-emitting diodes DEL.

Substrate 10 may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The semiconductor substrate may be doped or undoped. Substrate 10 may be made of an insulating material, for example, of sapphire, or glass, or of ceramic. Preferably, the substrate is made of silicon, particularly of single-crystal silicon or polysilicon.

Preferably, substrate 10 is an undoped or lightly-doped semiconductor substrate with a dopant concentration smaller than or equal to $5*10^{16}$ atoms/cm3, preferably substantially equal to $10^{15}$ atoms/cm3. Substrate 10 has a thickness in the range from 275 µm to 1,500 µm, preferably 725 µm. Substrate 10 may correspond to a multilayer structure of silicon-on-insulator type, SOI.

In the case of a silicon substrate 10, examples of P-type dopants are boron (B) or indium (In) and examples of N-type dopants are phosphorus (P), arsenic (As), or antimony (Sb). Preferably, substrate 10 is P-type boron-doped.

Surface 12 of silicon substrate 10 may be a <100> surface.

Seed pads 14, also called seed islands, are made of a material favoring the growth of wires 20. As an example, the material forming seed pads 14 may be a nitride, a carbide, or a boride of a transition metal from column IV, V, or VI of the periodic table of elements or a combination of these compounds. As an example, seed pads 14 may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate (ZrB2), zirconium nitride (ZrN), silicon carbide (SiC), tantalum carbo-nitride (TaCN), magnesium nitride in MgxNy form, where x is approximately equal to 3 and y is approximately equal to 2, for example, magnesium nitride in Mg3N2 form or magnesium gallium nitride (MgGaN), tungsten (W), tungsten nitride (WN), or a combination thereof. Seed pads 14 may be doped with the same conductivity type as substrate 10.

The thickness of each seed pad 14 is in the range from 5 nm to 100 nm, preferably 25 nm.

The conductive material forming conductive layer 18 is selected from the group of transition metals, particularly the materials and alloys comprising elements W, Ta, Re, Os, Mo, Nb, Pt, Pd, Cr, Zr, Hf, Cu, Co, Ni, and Ti including their silicided, nitrided, or carbided forms; preferably from among silicides and metals capable of forming a silicide, particularly Pt, PtSi, Ti, $TiSi_2$, Co, CoSi2, CoSi, Co2Si, Ni, NiSi, NiSi2, W, WSi2, Mo, MoSi2, Ta, and TaSi2; more preferably from among silicides and metals capable of forming a stable silicide on silicon at a 1,000° C. temperature, particularly W, WSi2, Mo, MoSi2, Ta, TaSi2, Ti, TiSi2, Co, CoSi2, TiW, TiWSi; more preferably still from among silicides and metals capable of forming a silicide having a thermal expansion coefficient equal, to within 10%, to the thermal expansion coefficient of silicon or of polysilicon, particularly W, WSi2, TiW, TiWSi2. Advantageously, the material may be selected so that it forms a silicide in contact with the silicon substrate. For example, the material deposited to form the conductive layer may be W, Ti, TiW, Co, or Ni which, due to the manufacturing method, partially forms a silicide. Thus, the mechanical and electric contact is advantageously improved.

Preferably, the conductive material forming the conductive layer is tungsten (W). The electric resistivity of the conductive material is lower than 10 µohm·cm at 300 K. The thickness of conductive layer 18 is in the range from 50 nm to 1,000 nm, preferably 300 nm.

The shape of openings 19 present in conductive layer 18 may be adapted to the desired cross-section of wires 20. As an example, as shown in FIG. 1B, openings 19 have a circular shape. As a variation, openings 19 may have an oval or polygonal shape, particularly triangular, rectangular, square, or hexagonal. FIG. 1B shows the contour of seed pads 14 by a dotted line of circular shape. However, seed pads 14 may have a different shape, particularly oval or polygonal, particularly triangular, rectangular, square, or hexagonal.

Insulating layer 26 may be made of a dielectric material, for example, of silicon oxide (SiO2), of silicon nitride (SixNy, where x is approximately equal to 3 and y is approximately equal to 4, for example, Si3N4), of silicon oxynitride (SiOxNy, where x may be approximately equal to ½ and y may be approximately equal to 1, for example, Si2ON2), of aluminum oxide (Al2O3), of hafnium oxide (HfO2), or of diamond. As an example, the thickness of insulating layer 26 is in the range from 5 nm to 800 nm, for example, equal to approximately 30 nm. In the present embodiment, insulating layer 26 extends, in particular, in each opening 19 of seed pad 18 all the way to upper wall 15 of the corresponding seed pad 14, between conductive layer 18 and wire 20.

Wires 20 are at least partly formed from at least one semiconductor material. The semiconductor material may be silicon, germanium, silicon carbide, a III-V compound, a II-VI compound, or a combination of these compounds.

Wires 20 may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 20 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 20 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 20 may have different shapes, such as, for example, oval, circular, or polygonal, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire 20 may be in the range from 50 nm to 2.5 µm. Height H1 of each wire 20 may be in the range from 250 nm to 50 µm. Each wire 20 may have an elongated semiconductor structure along an axis substantially perpendicular to surface 12. Each wire 20 may have a general cylindrical shape. The axes of two wires 20 may be distant by from 0.5 µm to 20 µm, and preferably from 2.5 µm to 6 µm. As an example, wires 20 may be regularly distributed as shown in FIG. 1B. As an example, wires 20 may also be regularly distributed in a hexagonal network.

As an example, lower portion 22 of each wire 20 is mainly formed of the III-N compound, for example, gallium nitride, which may have the same doping type as substrate 10, for example, type N, for example, silicon-doped. Lower portion 22 extends up to a height H2 which may be in the range from 100 nm to 25 µm.

As an example, upper portion 24 of each wire 20 is at least partially made of a III-N compound, for example, GaN. Upper portion 24 may be N-type doped, possibly less heavily doped than lower portion 22, or may not be intentionally doped. Upper portion 24 extends up to a height H3 which may be in the range from 100 nm to 25 µm.

Shell 28 may comprise a stack of a plurality of layers, particularly comprising:
  an active layer covering upper portion 24 of the associated wire 20;
  an intermediate layer having a conductivity type opposite to that of lower portion 22 covering the active layer; and
  a bonding layer covering the intermediate layer and covered with electrode 30.

The active layer is the layer from which most of the radiation delivered by light-emitting diode DEL is emitted. According to an example, the active layer may comprise confinement means, such as multiple quantum wells. It is for example formed of an alternation of GaN and of InGaN layers having respective thicknesses from 3 to 20 nm (for example, 8 nm) and from 1 to 10 nm (for example, 2.5 nm). The GaN layers may be doped, for example, N- or P-type doped. According to another example, the active layer may comprise a single InGaN layer, for example, having a thickness greater than 10 nm.

The intermediate layer, for example, P-type doped, may correspond to a semiconductor layer or to a stack of semiconductor layers and allows the forming of a P-N or P-I-N junction, the active layer being comprised between the intermediate P-type layer and upper N-type portion 24 of the P-N or P-I-N junction.

The bonding layer may correspond to a semiconductor layer or to a stack of semiconductor layers and enables to form an ohmic contact between the intermediate layer and electrode 30. As an example, the bonding layer may be very heavily doped, of a type opposite to that of lower portion 22 of each wire 20, until degeneration of the semiconductor layer(s), for example, P-type doped at a concentration greater than or equal to 1020 atoms/cm3.

The stack of semiconductor layers may comprise an electron barrier layer formed of a ternary alloy, for example, made of aluminum gallium nitride (AlGaN) or of aluminum indium nitride (AlInN) in contact with the active layer and the intermediate layer, to provide a good distribution of electric carriers in the active layer.

Electrode 30 is capable of biasing the active layer of each wire 20 and of letting through the electromagnetic radiation emitted by light-emitting diodes DEL. The material forming electrode 30 may be a transparent and conductive material such as indium tin oxide (ITO), aluminum zinc oxide, or graphene. As an example, electrode layer 30 has a thickness in the range from 5 nm to 200 nm, preferably from 20 nm to 50 nm.

Conductive layer 32 preferably corresponds to a metal layer, for example, aluminum, silver, copper, or zinc. As an example, conductive layer 32 has a thickness in the range from 20 nm to 300 nm, preferably from 100 nm to 200 nm.

Encapsulation layer 34 is made of an at least partially transparent insulating material. The minimum thickness of encapsulation layer 34 is in the range from 250 nm to 50 μm so that encapsulation layer 34 fully covers electrode 30 at the top of light-emitting diodes DEL. Encapsulation layer 34 may be made of an at least partially transparent inorganic material. According to an example, encapsulation layer 34 is made of silicone. According to another example, the inorganic material is selected from the group comprising silicon oxides, of type SiOx where x is a real number between 0 and 2, or SiOyNz where y is a real number between 0 and 2 and z is between 0 and 0.57, and aluminum oxides, for example, Al2O3. Encapsulation layer 34 may be made of an at least partially transparent organic material. As an example, encapsulation layer 34 is an epoxide polymer.

Conductive pads 36, 38 are adapted to the type of method used to connect optoelectronic device 5 to another circuit, for example, a printed circuit having optoelectronic device 5 bonded thereto. The connections methods may comprise wire bonding operations. The wire bonding may be performed with a gold, silver, copper, or aluminum wire.

The biasing of each light-emitting diodes DEL of assembly A is obtained by connecting conductive pad 36 to a source of a first reference potential and by connecting conductive pad 38 to a source of a second reference potential. As an example, in the case of N-type doped wire 20, the first reference potential may be greater than the second reference potential and the source of the second reference potential may correspond to ground.

Conductive layer 18 enables to convey current with decreased losses by Joule effect. Further, conductive layer 18 enables to improve the homogeneity of the current flowing through each light-emitting diode DEL. The fact for conductive layer 18 to partially cover upper wall 15 of each seed pad 14 in addition to lateral walls 16 advantageously enables to increase the contact surface area between each seed pad 14 and conductive layer 18.

Figure 2:
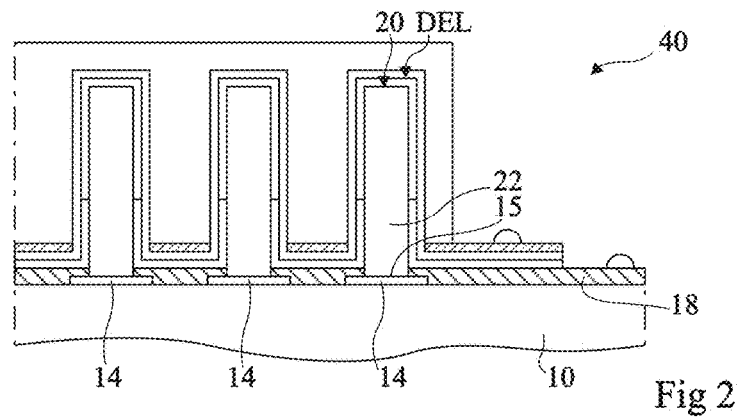
FIGS. 2 to 7 are partial simplified cross-section views of other embodiments of an optoelectronic device comprising microwires or nanowires.

FIG. 2 is a view similar to FIG. 1A of another embodiment of an optoelectronic device 40. Optoelectronic device 40 comprises all the elements of optoelectronic device 5 shown in FIG. 1A, with the difference that conductive layer 18 covers upper wall 15 of each seed pad 14 to come into contact with lower portion 22 of wire 20 resting on seed pad 14. This advantageously enables to increase the contact surface area between conductive layer 18 and the base of each light-emitting diode DEL.

Figure 3:
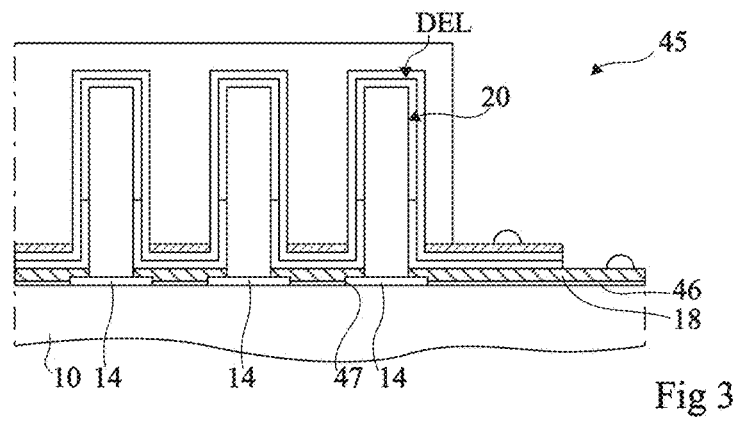

FIG. 3 is a cross-section view similar to FIG. 2 of another embodiment of an optoelectronic device 45. Optoelectronic device 45 comprises all the elements of optoelectronic device 40 shown in FIG. 2 with the difference that an insulating layer 46 is provided between substrate 10 and conductive layer 18. Insulating layer 46 comprises openings 47 at the locations of seed pads 14.

The dielectric materials previously described to form insulating layer 26 may also be used to form insulating layer 46, for example, SiO2, SiN, or Si3N4. As an example, the thickness of insulating layer 46 is in the range from 10 nm to 1,000 nm, and is for example, equal to approximately 200 nm. Insulating layer 46 advantageously enables to insulate conductive layer 18 from substrate 10.

Figure 4:
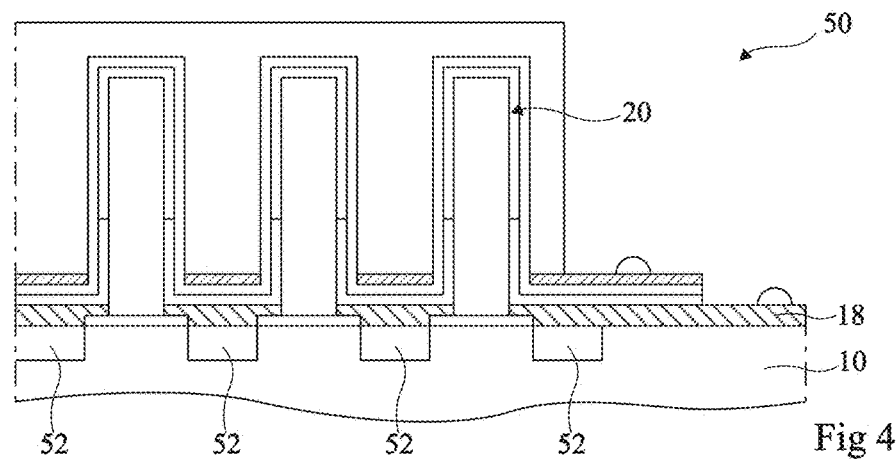

FIG. 4 is a cross-section view similar to FIG. 3 of another embodiment of an optoelectronic device 50. Optoelectronic device 50 comprises all the elements of optoelectronic device 45 shown in FIG. 3, with the difference that insulating layer 46 is replaced with a shallow trench insulation 52 or STI extending in substrate 10. The depth of each insulating trench 52 in substrate 10 is in the range from 150 nm to 2,000 nm.

Figure 5:
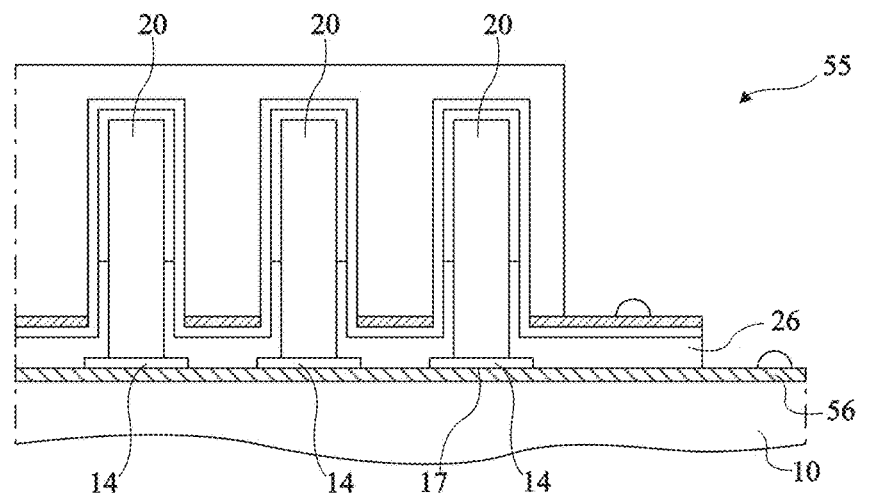

FIG. 5 is a cross-section view similar to FIG. 1A of another embodiment of an optoelectronic device 55. Optoelectronic device 55 comprises all the elements of optoelectronic device 5 shown in FIG. 1A, with the difference that conductive layer 18 is replaced with a conductive layer 56 extending on substrate 10, seed pads 14 resting on conductive layer 56. Conductive layer 56 is in contact with lower wall 17 of each seed pad 14. The conductive materials previously described to form conductive layer 18 may also be used to form conductive layer 56. As an example, the thickness of conductive layer 56 is in the range from 50 nm to 1,000 nm, and is for example equal to approximately 300 nm. Preferably, conductive layer 56 is substantially continuous at least in the region of optoelectronic device 55 where seed pads 14 are formed.

The fact of forming separated seed pads 14 on conductive layer 56 rather than a continuous seed layer resting on conductive layer 56 makes it easier to obtain the seed pads having the crystallographic properties desired to favor the growth of wires 20.

Figure 6:
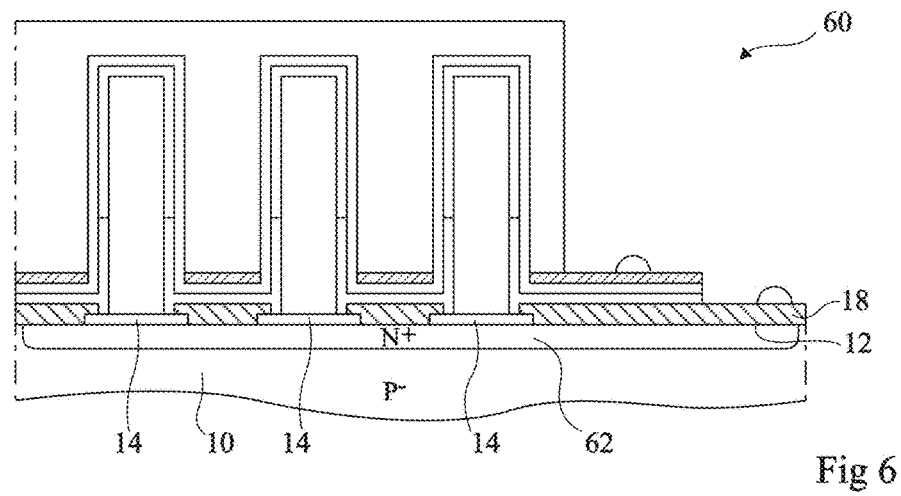

FIG. 6 is a cross-section view similar to FIG. 1 of another embodiment of an optoelectronic device 60. Optoelectronic device 60 comprises all the elements of optoelectronic device 5 shown in FIG. 1, substrate 10 being an undoped or lightly-doped semiconductor substrate of a first conductivity type, for example, type P, with a dopant concentration smaller than or equal to 5*1016 atoms/cm3. Optoelectronic device 60 further comprises a region 62 extending in semiconductor substrate 10 from surface 12 under seed pads 14 and under perforated conductive layer 18. Region 62 is a heavily-doped region. Preferably, the conductivity type of region 62 is opposite to the conductivity type of substrate 10. As an example, FIG. 6 shows a lightly-doped P-type substrate 10 and a heavily-doped N-type region 62. The dopant concentration of region 62 is in the range from 5*1016 atoms/cm3 to 2*1020 atoms/cm3, preferably from 1*1019 atoms/cm3 to 2*1020 atoms/cm3. The thickness of region 62 is in the range from 150 nm to several micrometers, preferably from 150 nm to 1 μm, more preferably from 150 nm to 400 nm.

Heavily-doped region 62 enables to further decrease losses by Joule effect on injection of current into light-emitting diodes DEL.

Figure 7:
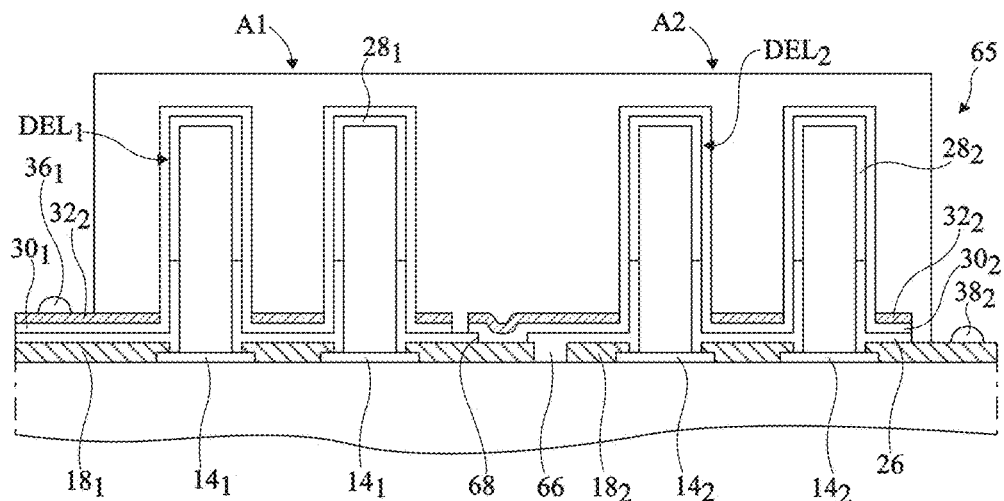

FIG. 7 is a cross-section view of an optoelectronic device 65 which comprises two assemblies A1, A2 of light-emitting diodes DEL. Each assembly A1, A2 of light-emitting diodes may have the same structure as assembly A shown in FIG. 1A. In FIG. 7, for the elements common to assemblies A1, A2, and A, index "1" is added to the references of the elements associated with assembly A1 and index "2" is added to the references of the elements associated with assembly A2.

Assembly A1 of light-emitting diodes is series-connected with assembly A2 of light-emitting diodes. For this purpose, the conductive layer 181 associated with assembly A1 of light-emitting diodes is separated by a distance from 1 μm to 50 μm from conductive layer 182 associated with assembly A2 of light-emitting diodes by a portion 66 of insulating layer 26. Further, electrode 302 and conductive layer 322 of assembly A2 of light-emitting diodes DEL2 extend all the way to an opening 68 provided in insulating layer 26 to come into contact with conductive layer 181 of assembly A1.

Electrode 301 of assembly A1 of light-emitting diodes is connected to the source of the first reference potential by contact pad 361 and conductive layer 182 of assembly A2 of light-emitting diodes is connected to the source of the second reference potential by contact pad 382. The difference between the first and second reference potentials should be greater than the sum of the threshold voltages of each diode assembly to forward-bias the two series-connected diode assemblies. As an example, the difference between the first and second reference potentials is in the order of 6 V for two assemblies of series-connected GaN light-emitting diodes.

FIG. 7 shows an optoelectronic device 65 comprising two assemblies A1, A2 of series-connected light-emitting diodes. The number of assemblies of series-connected light-emitting diodes may be larger. Optoelectronic device 65 may comprise from 2 to more than 100 assemblies of series-connected light-emitting diodes. The association of assemblies of series-connected light-emitting diodes enables to increase the maximum amplitude of the power supply voltage applied to the assemblies of light-emitting diodes, which is equal to the difference between the first and second reference potentials. As an example, the power supply voltage may have a maximum amplitude greater than or equal to 6 V, for example, approximately 12 V, 24 V, 48 V, 110 V, or 240 V.

The active layer of shell 281 may be manufactured identically or not to the active layer of shell 282. For example, the active layer of shell 281 may be adapted to emit blue light and the active layer of shell 282 may be adapted to emit green light. This may be obtained, in particular, by adapting the thicknesses or the compositions of the quantum wells forming the active layers of shells 281 and 282.

As an example, optoelectronic device 65 may comprise a third assembly of light-emitting diodes series-connected to assemblies A1 and A2. As an example, this third general light-emitting diode may be adapted to emit red light. The composition of the blue, green, and red lights may then be selected so that the human eye perceives white light by composition of the colors.

FIGS. 8A to 8D illustrate steps of an embodiment of a method of manufacturing optoelectronic device 5 shown in FIG. 1.

Figure 8A:
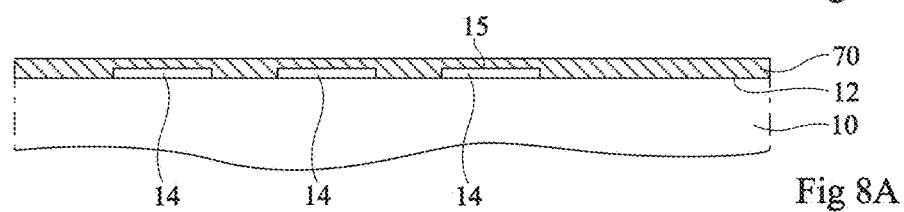
FIGS. 8A to 8D are partial simplified cross-section views of structures obtained at successive steps of another embodiment of a method of manufacturing the optoelectronic device shown in FIGS. 1A and 1B.

FIG. 8A shows the structure obtained after the steps of:
(1) Forming, on surface 12 of substrate 10, seed pads 14.
Seed pads 14 may be obtained by depositing a seed layer on surface 12 and by etching portions of the seed layer all the way to surface 12 of substrate 10 to delimit the seed pads. The seed layer may be deposited by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition (ALD). Further, methods such as evaporation or reactive cathode sputtering may be used.

When seed pads 14 are made of aluminum nitride, they may be substantially textured and have a preferred polarity. The texturing of pads 14 may be obtained by an additional treatment performed after the deposition of the seed layer. It for example is an anneal under an ammonia flow (NH3).

(2) Depositing a continuous conductive layer 70 covering surface 12 and seed pads 14. Continuous conductive layer 70 may be deposited by a method of PVD or CVD type, preferably by a PVD-type method.

Figure 8B:
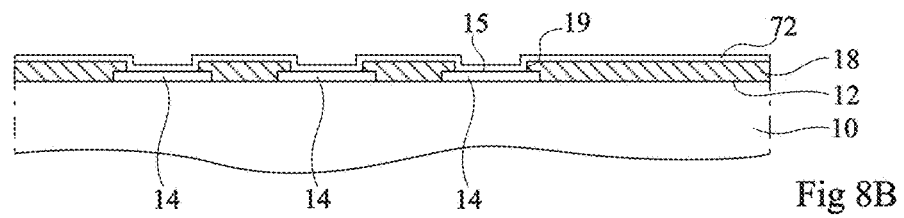

FIG. 8B shows the structure obtained after the steps of:
(3) Etching openings 19 in continuous conductive layer 70 to expose a portion of upper portion 15 of each seed pad 14. Conductive layer 70 comprising openings 19 corresponds to previously-described conductive layer 18. The etching of openings 19 may be performed by dry etching, for example, plasma etching.

(4) Forming a continuous insulating layer 72 covering conductive layer 18 and seed pads 14. The deposition of continuous insulating layer 72 may be performed by PECVD, CVD, or LPCVD.

Figure 8C:
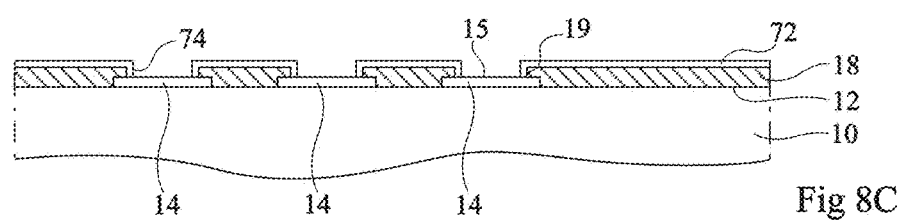

FIG. 8C shows the structure obtained after the steps of:
(5) Etching openings 74 in the continuous insulating layer to expose a portion of upper wall 15 of each seed pad 14. The etching of openings 72 may be performed by plasma etching or by wet etching.

Figure 8D:
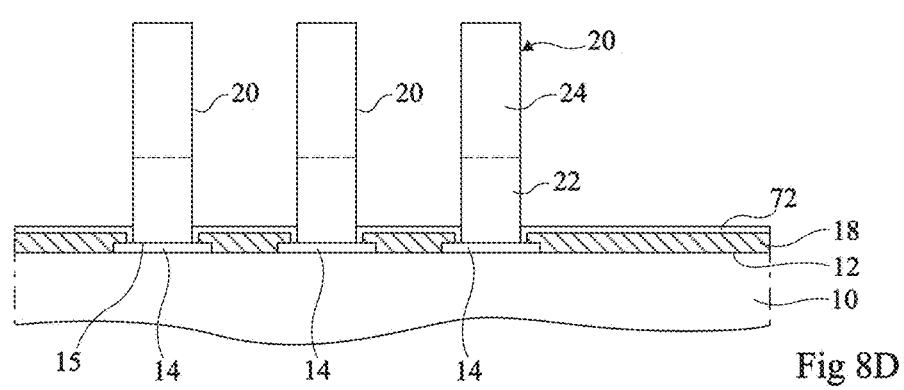

FIG. 8D shows the structure obtained after the steps of:
(6) Growing lower portion 22 of each wire 20 up to height H2 from the exposed portion of upper wall 15 of underlying seed pad 14.
(7) Growing upper portion 24 of height H3 of each wire 20 on the top of lower portion 22.

Wires 20 may be grown by a process of CVD, MOCVD, MBE, GSMBE, PAMBE, ALE, HVPE, ALD type. Further, electrochemical processes may be used, for example, chemical bath deposition (CBD), hydrothermal processes, liquid aerosol pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH3), tertiarybutylphosphine (TBP), arsine (AsH3), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane (SiH4).

The presence of silane among the precursor gases results in an incorporation of silicon within the GaN compound. A lower N-type doped portion 22 is thus obtained. This further translates as the forming of a silicon nitride layer, not shown, which covers the periphery of portion 22 of height H2, except for the top, as portion 22 grows.

For the growth of upper portion 24, the previously-described operating conditions of the MOCVD reactor are, as an example, maintained, but for the fact that the silane flow in the reactor is decreased, for example, by a factor greater than or equal to 10, or stopped. Even when the silane flow is stopped, upper portion 24 may be N-type doped due to the diffusion in this active portion of dopants originating from the adjacent passivated portions or due to the residual doping of GaN.

The subsequent steps of the manufacturing method are the following:

(8) Forming by epitaxy, for each wire 20, the layers forming shell 30. Given the presence of the silicon nitride layer covering the periphery of lower portion 22, the deposition of the layers forming shell 30 only occurs on the upper portion 24 of wire 20 which is not covered with the silicon nitride layer.

(9) Forming insulating layer 26, for example, by conformally depositing an insulating layer over the entire structure obtained at step (8) and etching this layer to expose upper portion 24 of each wire 20. In the previously-described embodiment, insulating layer 26 does not cover shell 30. As a variation, insulating layer 26 may cover a portion of shell 30. Further, insulating layer 26 may be formed before shell 30.

(10) Forming electrode 30, for example, by conformal deposition.

(11) Forming conductive layer 32, for example, by physical vapor deposition (PVD) over the entire structure obtained at step (10) or for example by evaporation or by cathode sputtering and etching of this layer to expose each wire 20.

(12) Forming encapsulation layer 34. When encapsulation layer 34 is made of silicone, encapsulation layer 34 may be deposited by a spin coating deposition method, by an inkjet printing method, or by a silk-screening method. When encapsulation layer 34 is an oxide, it may be deposited by CVD.

(13) Forming conductive pads 36, 38.

In the previously-described embodiment, insulating layer 26 does not cover the periphery of upper portion 24 of each wire 20. As a variation, insulating layer 26 may cover a portion of upper portion 24 of each wire 20. In this case, insulating layer 26 covers wire 20 up to a height greater than H2 and shell 30 covers wire 20 up to a height smaller than H3.

According to another variation, insulating layer 26 may, for each wire 20, partially cover the lower portion of shell 30.

According to a variation of the previously-described manufacturing method, the layers forming shell 30 may be formed before insulating layer 26 over the entire wire 20 or may only over a portion of wire 20, for example, upper portion 24.

Figure 9A:
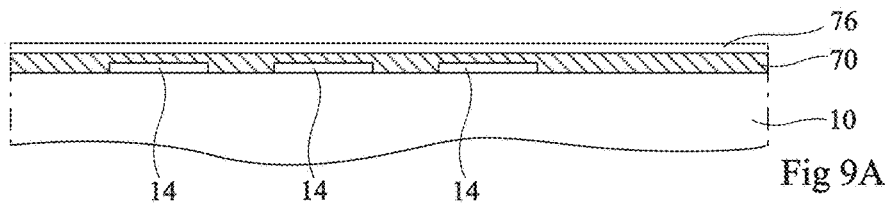
FIGS. 9A to 9C are partial simplified cross-section views of structures obtained at successive steps of another embodiment of a method of manufacturing the optoelectronic device shown in FIG. 2.
Figure 9B:
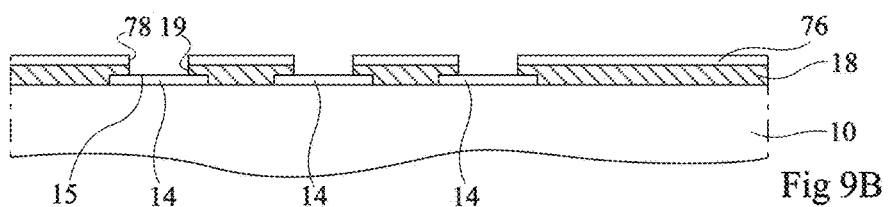
Figure 9C:
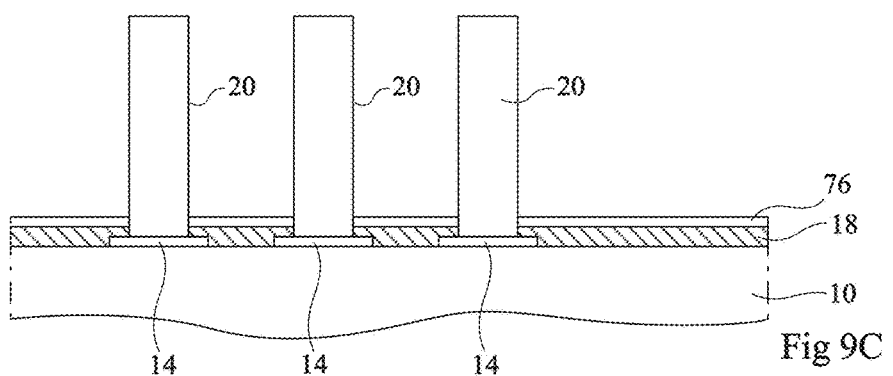

FIGS. 9A to 9C illustrate steps of an embodiment of a method of manufacturing optoelectronic device 40 shown in FIG. 2.

FIG. 9A shows the structure obtained after the steps of:

(1)' Forming seed pads 14, for example, similarly to previously-described step (1).

(2)' Depositing over the entire structure obtained at the previous step continuous conductive layer 70, for example, similarly to previously-described step (2).

(3)' Depositing over the entire structure obtained at the previous step a continuous conductive layer 76, for example, similarly to what has been previously described at step (4).

FIG. 9B shows the structure obtained after the steps of:

(4)' Etching openings 78 in insulating layer 76, for example, similarly to what has been previously described at step (5).

(5)' Etching openings 19 in continuous conductive layer 70 to continue openings 78 to expose a portion of upper wall 15 of each seed pad 14. The etching of the continuous conductive layer may be performed, for example, similarly to what has been previously described at step (3).

As an example, steps (4)' and (5)' may be carried out during a same technological step by adapting the etching species.

FIG. 9C shows the structure obtained after the growth of wires 20 which may be carried out according to previously-described steps (6) and (7).

The embodiment of the manufacturing method previously described in relation with FIGS. 9A to 9C has the advantage that the same mask may be used to form openings 19 in conductive layer 18 and openings 78 in layer 76. Thereby, as compared with the manufacturing method previously described in relation with FIGS. 8A to 8D, one less mask is used for the photolithography operations.

For the manufacturing of optoelectronic device 45 shown in FIG. 3, an embodiment of a manufacturing method may comprise, before the forming of seed pads 14, a step of forming an insulating layer over the entire surface 12 of substrate 10 and of etching openings in this insulating layer to expose portions of surface 12 at the locations of seed pads 14.

As an example, seed pad 14 may further extend above insulating layer 46, that is, lower surface 17 of seed pad 14 may partially come into contact with the upper surface of insulating layer 46.

For the manufacturing of optoelectronic device 50 shown in FIG. 4, an embodiment of a manufacturing method may comprise, before or after the forming of seed pads 14, a step of forming insulating trenches 52. An advantage of such a method is that insulating trenches 52 may be manufactured simultaneously to other insulating trenches already provided on the optoelectronic device. The manufacturing method then adds no additional steps.

As an example, in the case where insulating trenches 52 are manufactured before the forming of seed pads 14, at least one of seed pads 14 may further extend above one of the adjacent insulating trenches 52, that is, lower surface 17 of seed pad 14 may partially come into contact with the upper surface of the adjacent insulating trench 72.

Figure 10A:
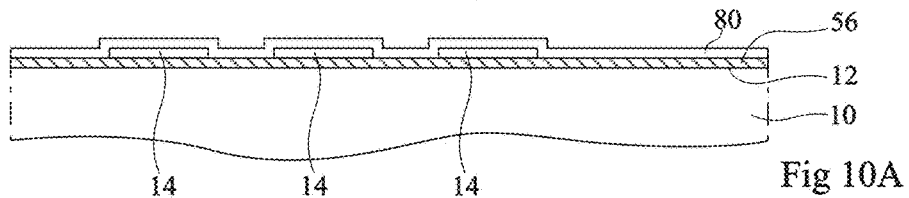
FIGS. 10A to 10C are partial simplified cross-section views of structures obtained at successive steps of another embodiment of a method of manufacturing the optoelectronic device shown in FIG. 5.
Figure 10B:
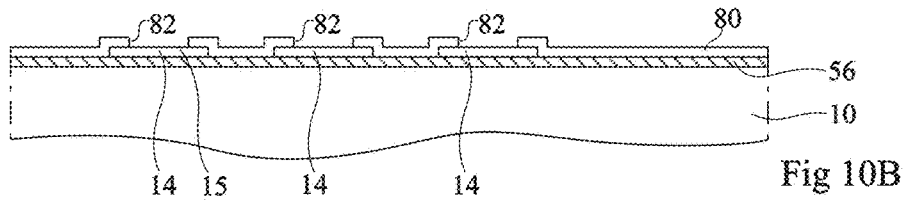
Figure 10C:
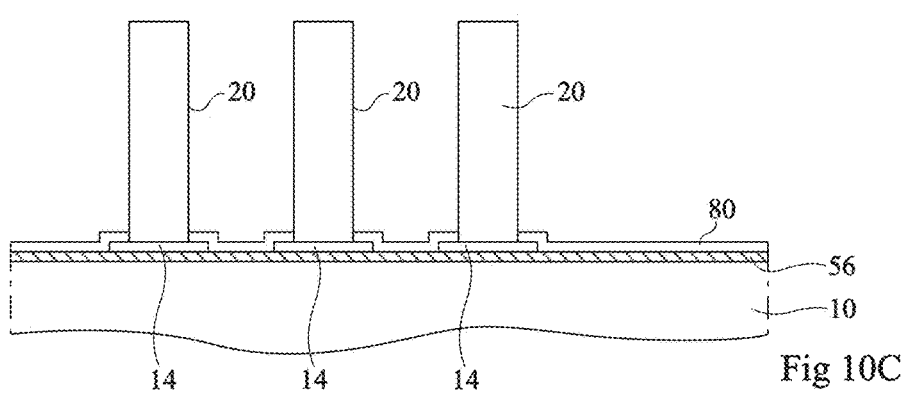

FIGS. 10A to 10C illustrate steps of an embodiment of a method of manufacturing optoelectronic device 55 shown in FIG. 5.

FIG. 10A shows the structure obtained after the steps of:

(1)" Depositing over the entire surface 12 of substrate 10 conductive layer 56, for example, similarly to previously-described step (2).

(2)" Forming seed pads 14 on conductive layer 56, for example, similarly to previously-described step (1).

(3)" Depositing over the entire structure obtained at the previous step a continuous conductive layer 80, for example, similarly to previously-described step (4).

FIG. 10B shows the structure obtained after the steps of:

(4)" Etching openings 82 in insulating layer 80 to expose a portion of upper wall 15 of each seed pad 14. The etching of openings 72 may be performed similarly to previously-described step (5).

As a variation, insulating layer 80 may be replaced with a step of nitriding the upper surface of the portions of conductive layer 56 which are not covered with pads 14.

FIG. 10C shows the structure obtained after the growth of wires 20 which may be carried out according to previously-described steps (6) and (7).

For the manufacturing of optoelectronic device 60 shown in FIG. 6, an embodiment of a manufacturing method may comprise, before the forming of seed pads 14, a step of dopant implantation into substrate 10 to form doped region 62. As a variation, region 62 may be formed, particularly by implantation, after wires 20.

Various embodiments with different variations have been described hereabove. It should be noted that those skilled in the art may combine various elements of these various embodiments and variations without showing any inventive step. As an example, semiconductor region 62 previously described in relation with FIG. 6 for optoelectronic device 60 further comprising perforated conductive layer 18 may be provided with optoelectronic device 55, previously-described in relation with FIG. 5, where conductive layer 56 is continuous.

The invention claimed is:

1. An optoelectronic device comprising:
   a support having a first surface;
   a first assembly of first light-emitting diodes comprising first wire-shaped, conical or frustoconical semiconductor elements, made of a first material and each resting on a second surface of a first pad made of a second material different from the first material, each first pad further comprising a third surface opposite to the second surface; and
   a first conductive layer connecting first pads and extending at least over a portion of the second surface or of the third surface of each first pad, the first conductive layer and/or the first pads resting on the support,
   wherein the first pads rest on the support and wherein the first conductive layer extends on the support between the first pads and covers a portion of the second surface of each first pad, the first conductive layer being open at the locations of each first semiconductor element.

2. The optoelectronic device of claim 1, wherein the first conductive layer is made of a material selected from the group comprising alloys comprising a transition metal or more than one transition metal from among W, Ta, Re, Os, Mo, Nb, Pt, Pd, Cr, Zr, Hf, Cu, Co, Ni, and Ti and their silicided, nitrided, and carbided forms.

3. The optoelectronic device of claim 1, wherein the first conductive layer is made of a material selected from the group comprising silicides and metals capable of forming a silicide, particularly Pt, PtSi, Ti, $TiSi_2$, Co, $CoSi_2$, CoSi, $Co_2Si$, Ni, NiSi, $NiSi_2$, W, $WSi_2$, Mo, $MoSi_2$, Ta, and $TaSi_2$.

4. The optoelectronic device of claim 1, wherein the first conductive layer is made of a material selected from the group comprising silicides and metals capable of forming a stable silicide on silicon at a 1,000° C. temperature, particularly W, $WSi_2$, Mo, $MoSi_2$, Ta and $TaSi_2$, Ti, $TiSi_2$, Co, $CoSi_2$, TiW, and TiWSi.

5. The optoelectronic device of claim 1, wherein first conductive layer is made of a material selected from among materials having a thermal expansion coefficient close, to within 10%, to the thermal expansion coefficient of silicon or of polysilicon, particularly W, $WSi_2$, TiW, $TiWSi_2$.

6. The optoelectronic device of claim 1, further comprising a first insulating layer at least partly covering the first conductive layer.

7. The optoelectronic device of claim 6, wherein the first insulating layer extends between the first semiconductor elements and the first conductive layer.

8. The optoelectronic device of claim 1, wherein the first conductive layer is in contact with the first semiconductor elements.

9. The optoelectronic device of claim 1, wherein the support comprises a semiconductor substrate and an insulating region between the substrate and the first conductive layer.

10. The optoelectronic device of claim 1, wherein each first pad is made of material selected from the group comprising a nitride, a carbide, or a boride of a transition metal from column IV, V, or VI of the periodic table of elements or a combination of these compounds.

11. The optoelectronic device of claim 1, wherein the support is a doped or undoped semiconductor substrate, with a dopant concentration smaller than or equal to $5*10^{16}$ atoms/cm³, the device further comprising a doped semiconductor region extending in the substrate from the first surface with a dopant concentration in the range from $5*10^{16}$ atoms/cm³ to $2*10^{20}$ atoms/cm³, said region being in contact with the first conductive layer.

12. The optoelectronic device of claim 1, further comprising:
   a first electrode connected to the first light-emitting diodes;
   a second assembly of second light-emitting diodes comprising second wire-shaped, conical, or frustoconical semiconductor elements, each resting on a fourth surface of a second pad, each second pad further comprising a fifth surface opposite to the fourth surface;
   a second conductive layer connecting the second pads and extending at least over a portion of the fourth surface or of the fifth surface of each second pad, the second conductive layer and/or the second pads resting on the support; and
   a second electrode connected to the second light-emitting diodes and coming into contact with the first conductive layer.

13. A method of manufacturing an optoelectronic device comprising the steps of:
   providing a support comprising a first surface;
   forming a first assembly of first light-emitting diodes comprising first wire-shaped, conical, or frustoconical semiconductor elements, each resting on a second surface of a first pad, each first pad further comprising a third surface opposite to the second surface; and
   forming a first conductive layer connecting first pads and extending at least over a portion of the second surface or of the third surface of each first pad, the first conductive layer and/or the first pads resting on the support,
   wherein the method comprises the successive steps of:
   forming the first pads on the support;
   covering the first pads and the support with a third conductive layer;
   forming first openings in the third conductive layer to form the first conductive layer, each first opening exposing a first portion of one of the first pads;
   covering the third conductive layer and the first exposed portions with a third insulating layer;
   forming second openings in the third insulating layer, each second opening exposing a second portion of one of the first pads; and
   growing the first semiconductor elements from the second exposed portions of the first pads.

14. An optoelectronic device comprising:
a support having a first surface;
a first assembly of first light-emitting diodes comprising first wire-shaped, conical or frustoconical semiconductor elements, made of a first material and each resting on a second surface of a first pad made of a second material different from the first material, each first pad further comprising a third surface opposite to the second surface; and
a first conductive layer connecting first pads and extending at least over a portion of the second surface or of the third surface of each first pad, the first conductive layer and/or the first pads resting on the support,
wherein the first conductive layer rests on the first surface and wherein each first pad rests on the first conductive layer on the side of the third surface and wherein a second insulating layer covers the first conductive layer and a portion of each first pad and wherein the portion of the first conductive layer which is not covered with the first pads is nitrided at its surface.

15. The optoelectronic device of claim 14, wherein the first conductive layer is made of a material selected from the group comprising alloys comprising a transition metal or more than one transition metal from among W, Ta, Re, Os, Mo, Nb, Pt, Pd, Cr, Zr, Hf, Cu, Co, Ni, and Ti and their silicided, nitrided, and carbided forms.

16. The optoelectronic device of claim 14, wherein the first conductive layer is made of a material selected from the group comprising silicides and metals capable of forming a silicide, particularly Pt, PtSi, Ti, $TiSi_2$, Co, $CoSi_2$, CoSi, $Co_2Si$, Ni, NiSi, $NiSi_2$, W, $WSi_2$, Mo, $MoSi_2$, Ta, and $TaSi_2$.

17. The optoelectronic device of claim 14, wherein the first conductive layer is made of a material selected from the group comprising silicides and metals capable of forming a stable silicide on silicon at a 1,000° C. temperature, particularly W, $WSi_2$, Mo, $MoSi_2$, Ta and $TaSi_2$, Ti, $TiSi_2$, Co, $CoSi_2$, TiW, and TiWSi.

18. The optoelectronic device of claim 14, wherein first conductive layer is made of a material selected from among materials having a thermal expansion coefficient close, to within 10%, to the thermal expansion coefficient of silicon or of polysilicon, particularly W, $WSi_2$, TiW, $TiWSi_2$.

19. The optoelectronic device of claim 14, wherein the support comprises a semiconductor substrate and an insulating region between the substrate and the first conductive layer.

20. The optoelectronic device of claim 14, wherein each first pad is made of material selected from the group comprising a nitride, a carbide, or a boride of a transition metal from column IV, V, or VI of the periodic table of elements or a combination of these compounds.

21. The optoelectronic device of claim 20, wherein the support is a doped or undoped semiconductor substrate, with a dopant concentration smaller than or equal to $5*10^{16}$ atoms/cm$^3$, the device further comprising a doped semiconductor region extending in the substrate from the first surface with a dopant concentration in the range from $5*10^{16}$ atoms/cm$^3$ to $2*10^{20}$ atoms/cm$^3$, said region being in contact with the first conductive layer.

22. The optoelectronic device of claim 14, further comprising:
a first electrode connected to the first light-emitting diodes;
a second assembly of second light-emitting diodes comprising second wire-shaped, conical, or frustoconical semiconductor elements, each resting on a fourth surface of a second pad, each second pad further comprising a fifth surface opposite to the fourth surface;
a second conductive layer connecting the second pads and extending at least over a portion of the fourth surface or of the fifth surface of each second pad, the second conductive layer and/or the second pads resting on the support; and
a second electrode connected to the second light-emitting diodes and coming into contact with the first conductive layer.

23. An optoelectronic device comprising:
a support having a first surface;
a first assembly of first light-emitting diodes comprising first wire-shaped, conical or frustoconical semiconductor elements, made of a first material and each resting on a second surface of a first pad made of a second material different from the first material, each first pad further comprising a third surface opposite to the second surface;
a first conductive layer connecting first pads and extending at least over a portion of the second surface or of the third surface of each first pad, the first conductive layer and/or the first pads resting on the support;
a first electrode connected to the first light-emitting diodes;
a second assembly of second light-emitting diodes comprising second wire-shaped, conical, or frustoconical semiconductor elements, each resting on a fourth surface of a second pad, each second pad further comprising a fifth surface opposite to the fourth surface;
a second conductive layer connecting the second pads and extending at least over a portion of the fourth surface or of the fifth surface of each second pad, the second conductive layer and/or the second pads resting on the support; and
a second electrode connected to the second light-emitting diodes and coming into contact with the first conductive layer.

* * * * *